United States Patent
Lindell

(10) Patent No.: US 7,209,718 B2
(45) Date of Patent: Apr. 24, 2007

(54) TRANSMITTER CONTROL CIRCUIT

(75) Inventor: Karl Bo Lindell, Lidingö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 308 days.

(21) Appl. No.: 10/481,188

(22) PCT Filed: Jun. 24, 2002

(86) PCT No.: PCT/EP02/06951

§ 371 (c)(1),
(2), (4) Date: Dec. 17, 2003

(87) PCT Pub. No.: WO03/003565

PCT Pub. Date: Jan. 9, 2003

(65) Prior Publication Data

US 2004/0176153 A1    Sep. 9, 2004

Related U.S. Application Data

(60) Provisional application No. 60/304,664, filed on Jul. 11, 2001.

(30) Foreign Application Priority Data

Jun. 29, 2001  (SE)  .................... 0102346

(51) Int. Cl.
*H04Q 11/12*  (2006.01)
*H04B 1/04*  (2006.01)

(52) U.S. Cl. .................... 455/126; 455/127.2
(58) Field of Classification Search ............ 455/126, 455/127.1, 127.2, 127.3, 115.1, 115.3; 330/278, 330/291

See application file for complete search history.

(56) References Cited

U.S. PATENT DOCUMENTS

| | | | |
|---|---|---|---|
| 4,066,965 A | * | 1/1978 | Schultz et al. ............ 375/295 |
| 4,547,746 A | | 10/1985 | Erickson et al. |
| 4,673,886 A | | 6/1987 | Bickley et al. |
| 5,206,600 A | | 4/1993 | Moehlmann |
| 5,208,550 A | * | 5/1993 | Iwane ..................... 330/129 |
| 5,257,415 A | | 10/1993 | Kumagai et al. |
| 5,287,555 A | | 2/1994 | Wilson et al. |
| 5,337,006 A | * | 8/1994 | Miyazaki ................. 330/130 |
| 5,894,496 A | | 4/1999 | Jones |

FOREIGN PATENT DOCUMENTS

| | | |
|---|---|---|
| EP | 0161027 A2 | 11/1985 |
| EP | 0594352 A2 | 4/1994 |
| EP | 0714174 A2 | 5/1996 |

OTHER PUBLICATIONS

International-Type Search Report for SE 0102346-4, Swedish Patent Office, Mar. 6, 2002.

* cited by examiner

*Primary Examiner*—Nguyen T. Vo

(57) ABSTRACT

The invention relates to an arrangement and to a method for providing a linear transmitter amplifier (11; 50) that remains linear even when the load varies significantly over the passage of time. A detector circuit (14; 48) on the output of the amplifier (11; 50) identifies which of the current or the voltage lies closest to its maximum value. This signal is then used as a real or actual value in a regulating system (17; 40) for linearising the amplifier.

2 Claims, 2 Drawing Sheets

TRANSMITTER CONTROL CIRCUIT

This patent application claims the benefit of priority from U.S. Provisional Patent Application Ser. No. 60/304,664 filed on Jul. 11, 2001. This application incorporates by reference the entire disclosure of U.S. Provisional Patent Application Ser. No. 60/304,664.

FIELD OF INVENTION

The present invention relates to an arrangement and to a method for retaining the linearity of a transmitter that is subjected to varying loads over the passage of time, while, at the same time, preventing overloading of the transmitter.

DESCRIPTION OF THE BACKGROUND ART

Transmitters that include linear transmitter amplifiers are adapted to operate at a given optimal load with which they can deliver maximum output power and still remain linear. They have respective maximum voltage values and maximum current values, $U_{max}$ and $I_{max}$ that they should not exceed. If the impedance of the load on a final stage of an amplifier becomes too low and an attempt is made to adjust to a nominal output voltage, the stage may become non-linear and over-modulated. The same applies when attempting to adjust to a nominal output current when the load impedance is too high.

Such linear transmitter amplifiers, particularly in respect of transmitters intended for portable or mobile use, are often subjected to excessively large and varying standing wave ratios (SWR) in respect of the load and therewith become non-linear. A typical example in this case is when the load is in the form of an antenna which when used in connection with a mobile transmitter (e.g. a mobile telephone) constantly generates different SWRs, depending on how the telephone is held, on the extent to which the antenna is covered by the hand holding the telephone the antenna, and so on. Ideally, the impedance is constantly nominal and no reflected waves occur. Since the load cannot, of course, be kept ideal, for aforesaid reasons, the load impedance of the transmitter will become higher or lower than the ideal load impedance. In case of excessively large variations, the amplifier will lie outside its linear range. Consequently, an amplifier in such a transmitter will be readily steered out beyond its tolerance levels. This results in increased out-channel radiation from the transmitter and causes the modulation to fall outside the tolerances.

Those attempts hitherto made to correct these problems have involved a number of solutions in which the final stage is isolated from the variable load with the aid of isolators or circulators. In simple terms, an isolator or circulator functions by not allowing any reflected power to return to the amplifier from the load, but is terminated instead. Unfortunately, a circulator or isolator is expensive, large and results in power losses.

U.S. Pat. No. 4,547,746 A teaches another known technique that uses a so-called directional coupler where an amplifier is adapted to change its character, whereafter the impedance is changed so as to match the instant value of the load at the amplifier output. This is implemented by virtue of so arranging a feedback signal from the amplifier output so as to obtain a signal that represents the difference between forwarded and reflected power. This signal is compared with a signal which shows the power required to obtain a voltage control signal that adjusts the supply voltage to the transistors in the amplifier. This prevents over-modulation or over-excitation and therewith provides load protection. The concept is also aimed at improving the efficiency of the amplifier.

Another well known technique uses an SWR detection circuit for monitoring the load impedance concerned, wherein a control signal initiates a decrease in the power output from the amplifier to a level that lies inwardly of the set threshold values. This technique, however, is seen primarily as a safety measure for preventing overloading and subsequent damage, rather than a measure for retaining the linearity of the amplifier.

There is therefore desired an amplifier which is able to retain its linearity in a transmitter, even when the load impedance varies significantly, and therewith prevent the over-modulation that can result therefrom.

SUMMARY OF THE INVENTION

Accordingly, the object of the present invention is to provide an arrangement that solves the problem of non-linearity and over-modulation of the amplifier in a transmitter when it is subjected to varying loads.

Another object of the present invention is to provide a method of transmitting and amplifying an input signal, with which over-modulation is prevented and with which linearity is retained at varying loads.

The problem is solved with an arrangement and a method on which the value of either the output current or the output voltage on the amplifier output is fed back to a control system and the current value or the voltage value that is closest to exceeding its maximum value ($I_{max}$ or $U_{max}$) is used in the control circuit as the real or actual value. The real value is compared with a set-point value or control point value in the control circuit and the result then fed back to the amplifier.

Thus, in respect of a given load impedance either voltage or current is the most critical, and in accordance with one embodiment of the proposed invention the most critical of these values at the moment in time is identified with the aid of a detector.

According to one variant of the invention, the output current or output voltage that lies closest to its maximum value is identified with the aid of diode detectors, and the amplitude is allowed to function as a real value in a control system that controls the output signal and thus prevents its over-modulation.

According to another variant of the invention, there is used instead an IQ-negative feedback where the transmitter output signal is mixed down to a baseband and feedback is effected in the baseband in the respective I and Q channels. The current or the voltage that lies closest to its maximum value on the transmitter output is also used as a real value in the transmitter control circuits with IQ-negative feedback in the case of this variant.

The aforesaid arrangement and method show that there can be obtained in several ways with the same basic concept a coupling that will solve the problems caused by varying loads and subsequent non-linearity of the amplifier, by adjusting with that value of the current and voltage which is greatest on the output signal at that moment in time. The coupling also shows that large and expensive isolators or circulators that cause significant power losses can be avoided.

The invention thus shows that the problem of linearity in conjunction with over-modulation can be achieved with inexpensive components and an innovative coupling, besides reducing power losses.

It is assumed that the features of the invention is expressed in the accompanying claims are novel. However, the background of the invention, its function, and further advantages afforded thereby, will best be understood from the following description made with reference to the accompanying drawings.

BRIEF DESCRIPTION OF THE DRAWINGS

Exemplifying embodiments of the invention will now be described with reference to the accompanying drawings, in which.

DESCRIPTION OF PREFERRED EMBODIMENTS

Figure 1:
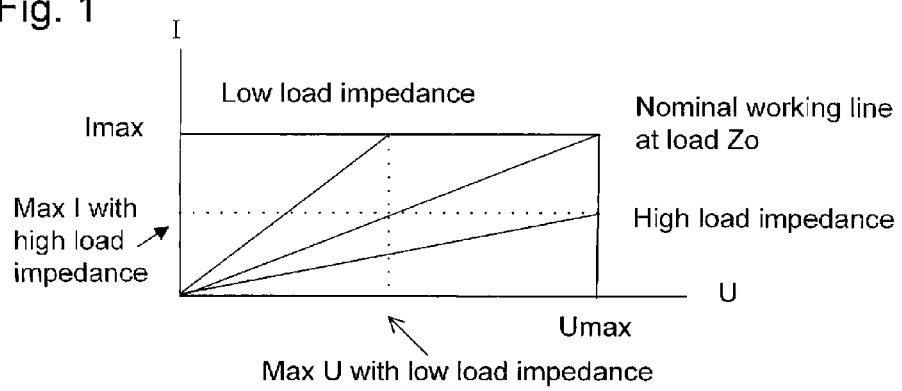
FIG. 1 is an electric current-voltage diagram illustrating different types of load impedances.

With the intention of giving a background to the problems solved by the inventive concept, FIG. 1 illustrates permitted nominal and actual loads directly on a final amplifier in a transmitter. The figure shows a nominal working line where the amplifier is subjected solely to resistive loads. Linear transmitter amplifiers are intended for a given nominal load, these amplifiers being able to deliver maximum output power and still remain linear (this includes feedback couplings and linearising couplings). In the case of a purely resistive load, the ratio $Z_0$ between voltage (U) and current (I) is precisely as illustrated by the nominal working line in FIG. 1. The amplifier functions linearly along this line up to the maximum nominal power that can be outputted. It will be seen that when the impedance of the load on the amplifier becomes low and an attempt is made to adjust to a nominal voltage, the stage will become non-linear and over-modulated. Thus, $I_{max}$ will be exceeded. Similarly, if an attempt to adjust to $I_{max}$ is made in the case of a high load impedance, $U_{max}$ will be exceeded with subsequent distortion and non-linearity as a result.

Figure 2:
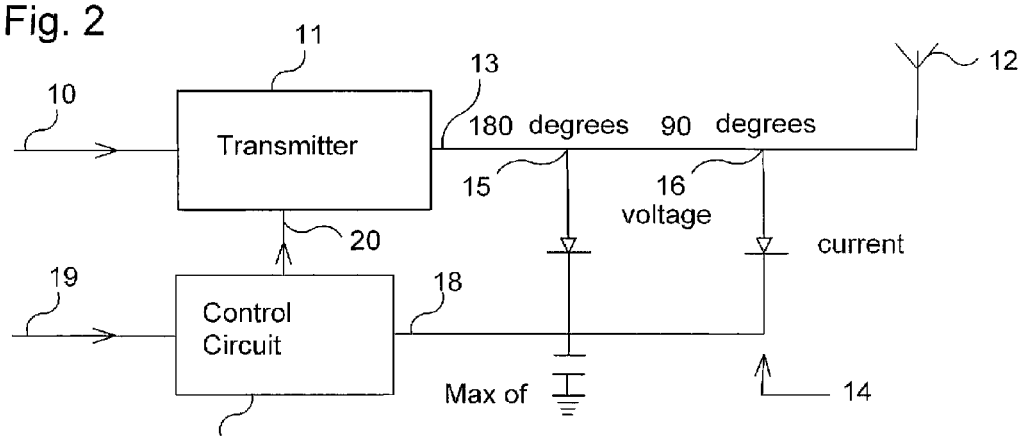
FIG. 2 is a coupling diagram corresponding to preferred embodiments.

FIG. 2 illustrates a coupling according to one preferred embodiment of the invention, where a transmitter 11 including at least one amplifying stage receives some form of input signal 10. This input signal may be any type of signal whatsoever, although, in the case of the illustrated embodiment, it is assumed for the sake of simplicity that the signal is an RF signal that shall be amplified and then transmitted via an antenna/load 12. The antenna thus functions as load and in this nature is a troublesome antenna since the load it represents and constantly sensed by the transmitter may vary significantly with time, as earlier mentioned.

Some form of detector circuit may be used to measure voltage and current on the transmitter output signal 13. As will be seen from FIG. 2, there is used in this preferred embodiment a double diode detector 14 that has two connection points 15 and 16 between transmitter 11 and load 12. It will be noted that any standard voltage meter whatsoever may be used to detect the voltage. The diode detector is therefore merely an example of a simple and efficient voltage detector.

It is known that the magnitude of a voltage on a transmission line is the same at the transmitter amplifier output as at a point n*180 degrees closer to the load. This applies to the current, which is also periodic in n*180 degrees. A point 15 is marked 180 degrees from the output in the figure. This point thus coincides with the first connecting point of the diode detector 14.

Figure 3:
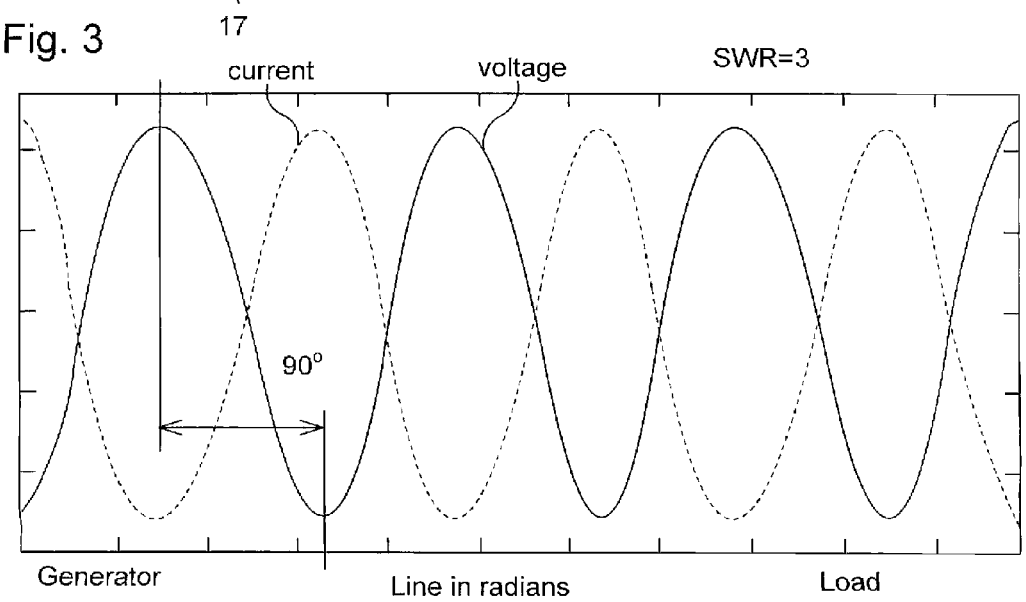
FIG. 3 illustrates how current and voltage behave along an electric conductor.

Since the current is displaced through 90 degrees relative to the voltage at all points along the transmission line, as illustrated in FIG. 3, the magnitude of the voltage 90 degrees from point 15, either towards the amplifier or towards the load, corresponds to the current in the amplifier. Here illustrated by the second connection point 16 of the diode detector.

The two connection points of the diode detector 14 between transmitter 11 and load 12 are therefore positioned so that the distance between said connection points on the transmission line will correspond to +/− n*90 degrees (a quarter-wavelength) along said line so as to obtain two voltages, of which one corresponds to the output voltage and the other corresponds to the output current. One of the measuring points is therefore placed *180 degrees from the output. The figure shows the position of the detector between amplifier 11 and control circuit 17.

Although the voltage could be measured directly on the output (n=0), it is preferred rather to measure the voltage slightly outwards on the transmission line. This is because the voltage is often easier to measure at a point n*180 degrees (n=1, 2, 3 . . . ) from the output.

Since the current is awkward to measure, it is therefore easier to measure the voltage at a point 16 which is located +/− 90 degrees from point 15. This point thus represents instant value of the voltage and the current.

Thus, FIG. 3 illustrates current and voltage between transmitter and load along the entire line between transmitter and load. It will be seen that current and voltage are mutually offset by 90 degrees at each given point between amplifier and load.

The coupling illustrated in FIG. 2 therewith gives an output voltage 13 which is determined by whether the voltage or $Z_0$ times the current in the amplifier is greatest at that moment in time, i.e. by which of the magnitudes I and U lie closest to their maximum ($I_{max}$ or $U_{max}$). The greatest of these magnitudes is determined by whether movement is along a load line that corresponds to low or high impedance in accordance with what is shown in FIG. 1. Subsequent to rectification, this output voltage 13 thus constitutes the output signal from the detector 14 and is used as the real value 18 in an amplifier control coupling 17.

There is preferably used as a set-point value 19 a signal that corresponds to the amplitude modulation envelope of the signal at that instance, multiplied by the gain of the amplifier at nominal load, so as to obtain the standard value at which the amplifier shall manage to operate in linear ranges. A comparison is then made and the difference between real value and set-point value results in the signal 20 which is fed back into the transmitter. This signal then regulates the drive power for instance, and therewith the output amplitude of the amplifier.

Quadrature modulation is one known method of generating linear modulation. Two baseband signals each modulate a respective HF signal with respect to amplitude, where said signals are offset by 90 degrees in relation to each other. The modulated signals are summated to obtain a desired signal that is phase-modulated and amplitude-modulated.

A typical method of linearising of the amplification chain in a transmitter for quadrature modulation is to use quadrature feedback coupling. An HF signal from the amplifier output is divided by down-mixing with HF signals offset through 90 degrees in quadrature components in the baseband. The quadrature components are then used as real values in amplitude feedback loops for corresponding modulating baseband signals.

Figure 4:
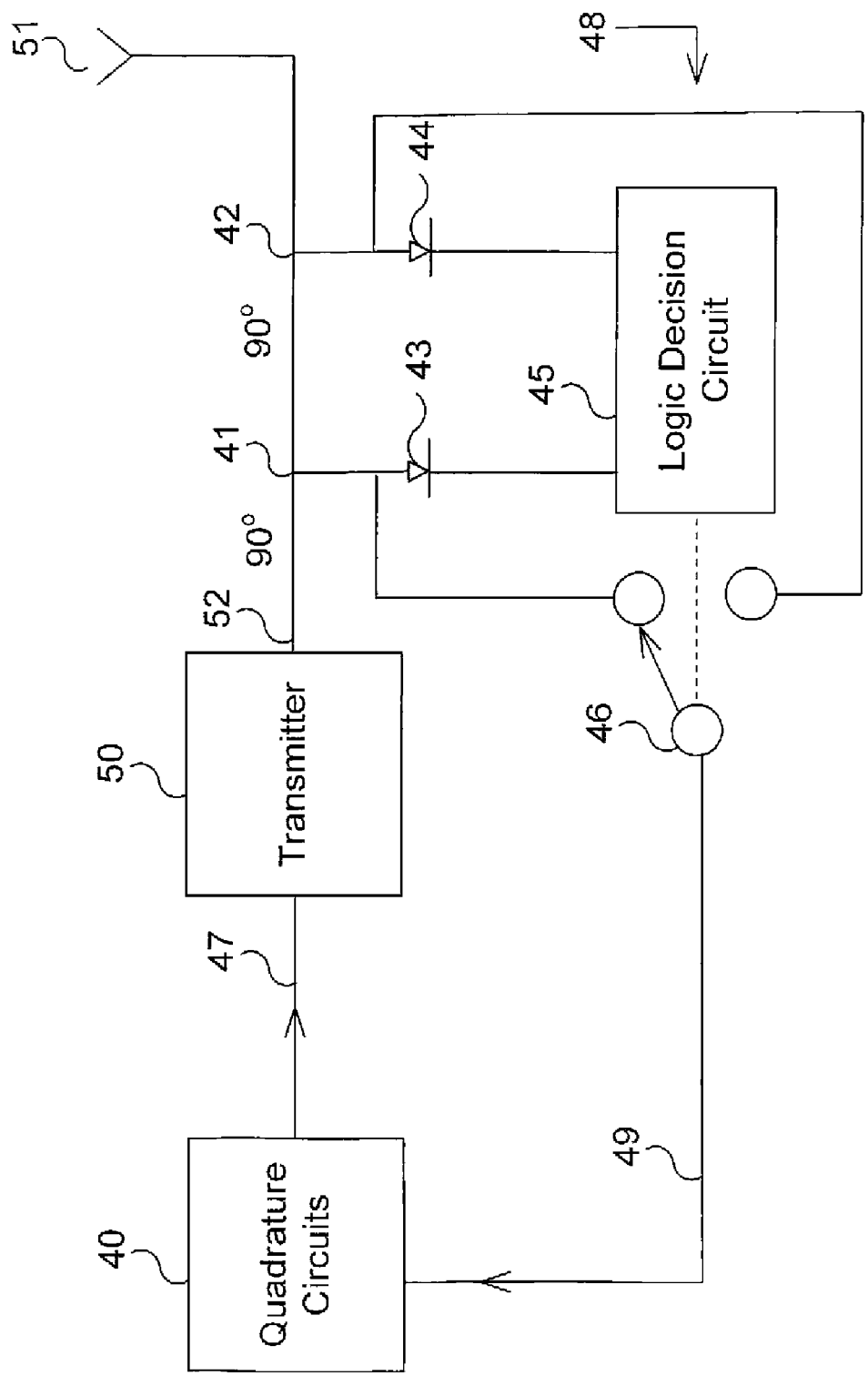
FIG. 4 is a coupling diagram illustrating an alternative embodiment.

In order for the present invention to be applied in such a transmitter, the signal to be returned from the transmitter output to the quadrature feedback circuit should represent the voltage or current that is greatest in relation to its nominal value. FIG. 4 illustrates such an arrangement in which a chosen output signal 49 representing current or voltage from the transmitter amplifier chain 50 is fed back to the quadrature circuits 40.

As with the previous embodiment, the connection from the transmitter 50 to the load 51 includes two lead terminals 41 and 42 and a detector circuit 48, which in a preferred embodiment comprises two diode detectors 43 and 44 that have a common output. One output thus represents voltage on the amplifier output 52, while the other represents current. In this embodiment, the voltage representing output is referenced 42 and the current representing output is referenced 41.

The detector circuit 48 functions to supply a logic decision circuit 45 which controls a switch 46 to the outlet on the transmitter output that gives the highest detected voltage. The switch 46 thus connects the measuring input of the quadrature feedback-coupling to the line outlet that has the highest amplitude, said detector output signal 49 being used as a real value in the transmitter.

The arrangement that includes the switch solves the problem of including the entire signal, which is necessary in respect of quadrature feedback-coupling, and not only the rectified variant which would have been the case if the detector circuit shown in FIG. 2 had been used.

The logic decision circuit 45 may be a simple comparison circuit, i.e. a comparator. In order to obtain a decision circuit that functions smoothly, it is also conceivable to provide the diodes with given filtration with respect to amplitude detection. The embodiment shows that the same function as that obtained with the embodiment shown in FIG. 2 can also be achieved with a quadrature feedback-coupled control system.

Other embodiments in which other parameters are controlled in the feedback coupling are conceivable. For example, an increase in the gain of the amplifier or the attenuation in a variable attenuator. Alternatively, it is conceivable to control or regulate a digital/analogue multiplier used in generating the baseband signal earlier in the modulation chain.

It will be noted that the aforedescribed invention will also provide advantages in respect of a linear amplifier. A non-linear amplifier also obtains advantages when the danger of over-modulation exists.

The invention claimed is:

1. An arrangement for amplifying and transmitting an input signal, comprising:
    a transmitter;
    a load coupled to the transmitter via a transmission line;
    a detector circuit being coupled to two measuring points on the transmission line between the transmitter and the load for the purpose of measuring two voltage amplitudes at said two measuring points, one of said voltage amplitudes representing the output voltage and the other representing the output current, the detector circuit adapted to deliver as a detector circuit output, a voltage or current on the transmitter output having a value closest to its respective maximum value at that moment in time;
    a control system for receiving the detector circuit output signal and adapted to feed back the detector circuit output signal to the transmitter, the control system further adapted to regulate the output signal of the transmitter;
    a quadrature feedback-coupled regulating system for regulating the transmitter output signal;
    a decision circuit included in the detector circuit adapted to identify the value of the voltage and the current on the transmitter output and select which of the voltage or the current on the transmitter output has the greatest amplitude; and
    a switch responsively coupled to an output of the decision circuit, the switch adapted to couple the selected transmitter output signal to said regulating system as a real value.

2. The arrangement for amplifying and transmitting an input signal according to claim 1, wherein the detector circuit further comprises two diode detectors that have a common output.

* * * * *